US012755867B2

(12) United States Patent
Ochi et al.

(10) Patent No.: US 12,755,867 B2
(45) Date of Patent: Oct. 6, 2026

(54) RECEPTION CABLE AND MEDICAL IMAGE DIAGNOSTIC SYSTEM

(71) Applicant: FUJIFILM Corporation, Tokyo (JP)

(72) Inventors: Hisaaki Ochi, Tokyo (JP); Yosuke Otake, Tokyo (JP); Masayoshi Dohata, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 92 days.

(21) Appl. No.: 18/939,237

(22) Filed: Nov. 6, 2024

(65) Prior Publication Data

US 2025/0157696 A1 May 15, 2025

(30) Foreign Application Priority Data

Nov. 13, 2023 (JP) ................................ 2023-192991

(51) Int. Cl.

| | |
|---|---|
| ***H05K 9/00*** | (2006.01) |
| ***G01R 33/36*** | (2006.01) |
| ***H01B 3/30*** | (2006.01) |
| ***H01B 3/44*** | (2006.01) |
| ***H01B 7/38*** | (2006.01) |
| ***H01B 11/10*** | (2006.01) |
| ***H01B 11/18*** | (2006.01) |
| ***H01B 11/20*** | (2006.01) |

(52) U.S. Cl.
CPC ......... *H01B 11/10* (2013.01); *G01R 33/3685* (2013.01); *H01B 3/306* (2013.01); *H01B 3/445* (2013.01); *H01B 7/38* (2013.01); *H01B 11/1878* (2013.01); *H01B 11/20* (2013.01); *H05K 9/0098* (2013.01)

(58) Field of Classification Search
CPC .................................................... H05K 9/0098
See application file for complete search history.

(56) References Cited

U.S. PATENT DOCUMENTS

| | | | | |
|---|---|---|---|---|
| 6,664,465 | B2 | 12/2003 | Seeber | |
| 11,018,717 | B1 * | 5/2021 | Waks | H05K 9/0098 |
| 2009/0315642 | A1 * | 12/2009 | Evers | H05K 9/0075 333/167 |
| 2015/0108983 | A1 * | 4/2015 | Chang | G01R 33/3815 324/318 |
| 2016/0015969 | A1 * | 1/2016 | Kiykioglu | H05K 9/0098 607/115 |
| 2025/0104887 | A1 * | 3/2025 | Chen | H01B 11/002 |

* cited by examiner

*Primary Examiner* — Hung V Ngo

(74) *Attorney, Agent, or Firm* — Studebaker Brackett PLLC

(57) ABSTRACT

Provided are a receive cable and a medical image diagnostic system capable of reducing the burden on imaging staff. A receive cable includes: a coaxial cable; a tubular shield conductor accommodating the coaxial cable and having at least one non-conductive cutout portion at an intermediate portion in the axis ξ direction; and a tubular conductor overlapping with the cutout portion and a part of each of two shield conductors located on both sides of the cutout portion, and is disposed with respect to the shield conductor via a gap portion in the diameter A direction of the shield conductor.

8 Claims, 9 Drawing Sheets

RECEPTION CABLE AND MEDICAL IMAGE DIAGNOSTIC SYSTEM

CROSS-REFERENCE TO RELATED APPLICATION

The present application claims priority under 35 U.S.C. § 119(a) to Japanese Patent Application No. 2023-192991 filed on Nov. 13, 2023, which is hereby expressly incorporated by reference, in its entirety, into the present application.

BACKGROUND OF THE INVENTION

1. Field of the Invention

The present invention relates to a receive cable and a medical image diagnostic system, particularly to a technology for reducing the burden on imaging staff involved in a magnetic resonance imaging apparatus.

2. Description of the Related Art

A receive coil used in a magnetic resonance imaging (MRI) apparatus receives signals generated from a subject. As a signal line for transmitting this signal, a coaxial cable is typically used. The receive coil is disposed inside a transmission coil provided on an interior wall of the gantry and in the vicinity of the subject.

In recent years, the number of channels in receive coils has increased, leading to a corresponding increase in the number of coaxial cables used for transmitting receiving signals. These coaxial cables are often bundled and accommodated within a tubular outer shield conductor (hereinafter, referred to as a shield conductor) and treated as a single cable (hereinafter, referred to as a receive cable). The shield conductor typically uses flexible materials such as mesh conductors, and the cable can be bent and placed within a range that does not become smaller than the allowable bending radius (generally about five times the diameter of the receive cable). As a result, the flexibility in setting the receive coil is enhanced.

The receive cable is used by being connected to the receive coil. Therefore, the shield conductor acts as an antenna by receiving electromagnetic waves of nuclear magnetic resonance frequency emitted by the transmission coil, and a current is induced on the shield conductor. In cases where a large current is induced on the shield conductor, heat generation may occur. To suppress this heat generation, one or more baluns (BALUNs: balanced-to-unbalanced transformers) may be provided in the receive cable (see U.S. Pat. No. 6,664,465B).

SUMMARY OF THE INVENTION

However, in a case where the number of channels of the receive coil increases, the number of coaxial cables also increases, inevitably increasing in the diameter and weight of the receive cable.

Furthermore, in a case where the shield conductor is considered a dipole antenna, the receiving gain generally increases as the diameter of the receive cable increases. As a result, the current induced on the shield conductor by the electromagnetic wave of the nuclear magnetic resonance frequency emitted by the transmission coil increases. It should be noted that, in the following description, the current induced on the shield conductor and the current induced on the receive cable are synonymous.

Therefore, to suppress the magnitude of the current induced on a large-diameter receive cable with a high number of channels to a level comparable to that induced on a small-diameter receive cable with a lower number of channels, it is necessary to equip the large-diameter receive cable with more baluns than the small-diameter receive cable.

That is, in a case where the receive cable increases in diameter, not only does the weight of the receive cable increase, but the weight of the balun also increases, resulting in a further increase in the weight of the entire receive cable including the balun.

The imaging staff performs handling works in a case where transporting and setting the receive coil, but there is a problem that the burden on the imaging staff increases in a case where the weight of the entire receive cable increases.

The present invention has been made in view of such circumstances, and an object thereof is to provide a receive cable and a medical image diagnostic system capable of reducing the burden on imaging staff.

An invention of a receive cable according to a first aspect comprises: a signal line; a tubular shield conductor that accommodates the signal line and has at least one cutout portion that is non-conductive at an intermediate portion in an axial direction; and a tubular conductor that overlaps with the cutout portion and a part of each of two shield conductors located on both sides across the cutout portion, and is disposed with respect to the shield conductor via a gap portion in a radial direction of the shield conductor.

According to the invention of the receive cable of the first aspect, by including the cutout portion and the tubular conductor, the current induced on the shield conductor and the signal line can be suppressed, thereby allowing for a reduction in the number of baluns. Therefore, the weight of the entire receive cable is reduced, making it possible to alleviate the burden on the imaging staff.

The receive cable according to a second aspect of the present invention, in the first aspect, it is preferable that, the gap portion is formed of a dielectric using a thermoplastic resin having a relative permittivity of less than 3.5.

The receive cable according to a third aspect of the present invention, in the second aspect, it is preferable that the dielectric is made of polytetrafluoroethylene or polyimide.

The receive cable according to a fourth aspect of the present invention, in any one of the first to third aspects, it is preferable that in a case where an axial length of the tubular conductor is 120 mm to 320 mm and the gap portion is formed of air or a dielectric with low relative permittivity, a length of the gap portion in the radial direction is 1 mm to 4 mm.

The receive cable according to a fifth aspect of the present invention, in any one of the first to fourth aspects, it is preferable that the receive cable includes a tubular sheath covering the shield conductor, in which the sheath has a removal portion at a position corresponding to the cutout portion, and the tubular conductor having a diameter equal to or smaller than the diameter of the sheath is disposed in the removal portion.

The receive cable according to a sixth aspect of the present invention, in any one of the first to fifth aspects, it is preferable that the tubular conductor is a flexible mesh member.

The receive cable according to a seventh aspect of the present invention, in any one of the first to sixth aspects, it is preferable that the receive cable includes one end at which a coil connection portion is provided and the other end opposite the one end at which a connector is provided, and a single balun is provided at a position closer to the other end than the one end.

The receive cable according to the eighth aspect of the present invention, in the seventh aspect, it is preferable that the balun is provided at a position within 20 cm from the other end toward the one end.

A medical image diagnostic system according to a ninth aspect of the present invention comprises: the receive cable according to any one of the first to eighth aspects; and a magnetic resonance imaging apparatus.

According to the present invention, it is possible to reduce the burden on the imaging staff.

DESCRIPTION OF THE PREFERRED EMBODIMENTS

Hereinafter, embodiments of a receive cable and a medical diagnostic system according to the present invention will be described with reference to the accompanying drawings.

Figure 1:
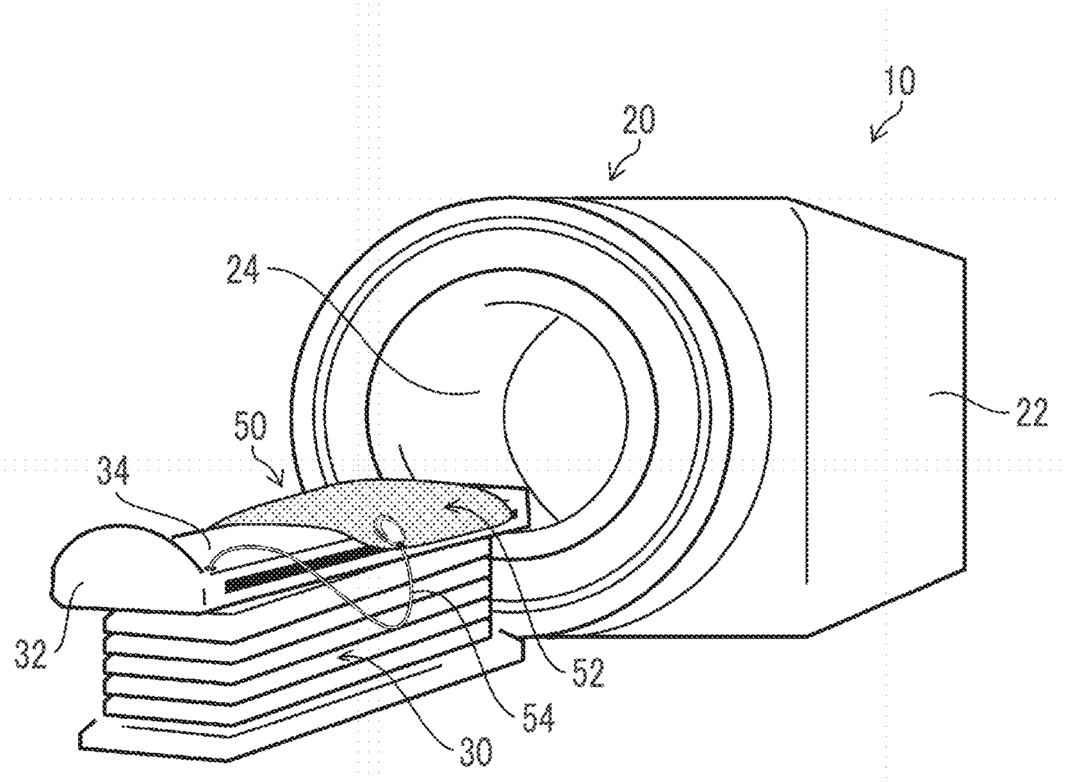
FIG. 1 is an external perspective view of a medical diagnostic system according to the present invention.

FIG. 1 is an external perspective view of a medical image diagnostic system 10 according to an embodiment of the present invention.

As shown in FIG. 1, the medical image diagnostic system 10 according to the embodiment comprises a magnetic resonance imaging apparatus (hereinafter referred to as an MRI apparatus) 20 and a receive cable 54 connected to a receive coil 52. The MRI apparatus 20 and the receive cable 54 are examples of the magnetic resonance diagnostic apparatus and the receive cable according to the present invention, respectively. In addition, in the present specification, a configuration where the receive cable 54 is connected to the receive coil 52 is referred to as a receive coil unit 50.

The MRI apparatus 20 is installed in an examination room of the image diagnostic facility. In the examination room, the subject is placed on the top plate 34 of the table 32 of the bed apparatus 30, and then is transported toward the gantry 22 of the MRI apparatus 20 by the movement operation of the table 32.

The MRI apparatus 20 has a gantry 22. The gantry 22 has a cylindrical bore 24, which is a cylindrical imaging space, and the table 32 moves into this bore 24.

Internal Configuration of MRI Apparatus

Figure 2:
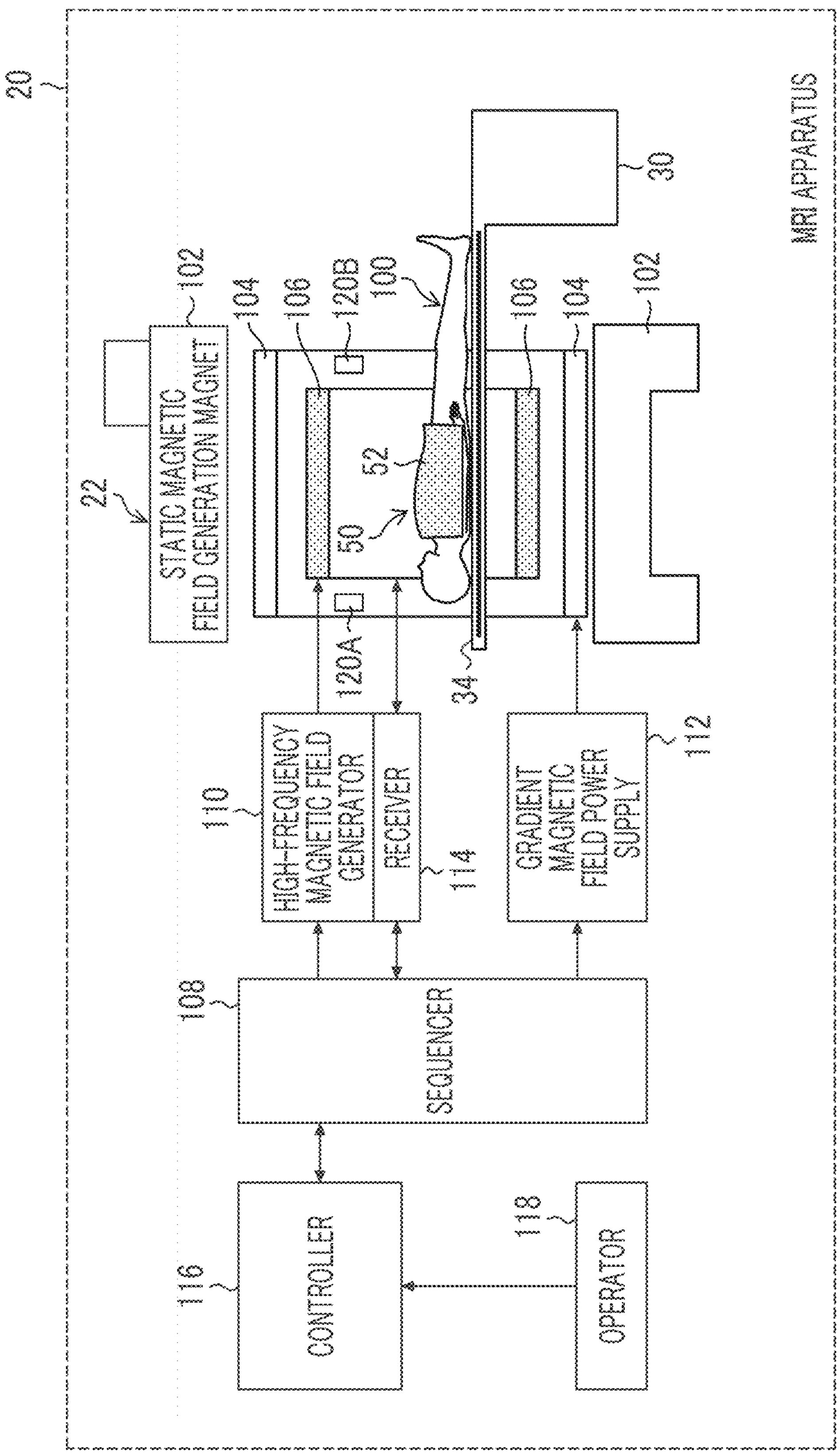
FIG. 2 is a schematic view showing the internal configuration of the MRI apparatus shown in FIG. 1.

FIG. 2 is a schematic view showing an internal configuration of the MRI apparatus 20.

As shown in FIGS. 1 and 2, the MRI apparatus 20 of the present example comprises a static magnetic field generation magnet 102, a gradient magnetic field coil 104, an radio frequency (RF) coil (hereinafter, referred to as a transmission coil) 106, and a receive coil 52.

The static magnetic field generation magnet 102 generates a uniform static magnetic field in the bore 14 where the subject 100 is positioned. The gradient magnetic field coil 104 generates a gradient magnetic field in the bore 14. The transmission coil 106 generates a high-frequency magnetic field to induce a nuclear magnetic resonance (NMR) signal (Hereinafter, the signal will be referred to as the NMR signal) in the atomic nuclei of atoms constituting the tissue of the subject 100. The receive coil 52 detects the NMR signal generated from the subject 100.

The subject 100 is placed on the top plate 34 of the table 32, and the table 32 is moved to the bore 24, so that the examination site of the subject 100 is positioned at the center of the static magnetic field within the bore 24.

The sequencer 108 sends commands to the high-frequency magnetic field generator 110 and the gradient magnetic field power supply 112 in accordance with the imaging sequence (pulse sequence) to generate the high-frequency magnetic field and the gradient magnetic field, respectively.

The generated high-frequency magnetic field is applied to the subject 100 as a pulsed high-frequency magnetic field (RF pulse) via the transmission coil 106. The NMR signal generated from the subject 100 is received by the receive coil 52 and detected by the receiver 114.

The gradient magnetic field coil 104 includes gradient magnetic field coils in the three directions of X, Y, and Z, and generates gradient magnetic fields in response to signals from the gradient magnetic field power supply 112.

A nuclear magnetic resonance frequency (detection reference frequency f0) to be used as a reference for detection in the receiver 114 is set by the sequencer 108. The sequencer 108 controls the operation of each unit according to pre-programmed timing and intensity. Among programs, a program that particularly describes the timing and intensity of RF pulses, gradient magnetic fields, and signal reception is referred to as a pulse sequence.

Various pulse sequences depending on the purpose are known, but the detailed description thereof will be omitted here.

The controller 116 controls the operations of each unit of the MRI apparatus 20 via the sequencer 108. In addition, the controller 116 receives the signal detected by the receiver 114 and performs various types of signal processing, including image reconstruction. The receiver 114 orthogonally phase-detects the echo signal (NMR signal), which is an analog wave, based on the set detection reference frequency f0, converts the signal into raw data, and then transmits the raw data to the controller 116. This raw data is also referred to as an echo signal or measurement data.

The controller 116 receives various instruction inputs from the operator 118 and comprehensively controls each unit of the MRI apparatus 20. In addition, the controller 116 performs processing to convert the echo signal in the spatial frequency domain, received via the sequencer 108, into an image in real space by inverse Fourier transform, and generates the MRI image.

The controller 116 is implemented using a general-purpose computer, such as a personal computer or a microcomputer. The controller 116 includes a central processing unit (CPU), a read-only memory (ROM), a random access memory (RAM), and an input/output interface.

In the controller 116, various programs, including the control program stored in the ROM, are expanded in the RAM, and the programs expanded in the RAM are executed by the CPU. As a result, the functions of each unit of the MRI apparatus 20 are realized, and various arithmetic processing and control processing operations are executed via the input/output interface.

The operator 118 includes a mouse, a keyboard, and the like, and functions as a part of a graphical user interface (GUI) that receives an input from the imaging staff by using a display operation window of a display (not shown).

That is, the operator 118 functions as a GUI for the imaging staff to start and stop (including pausing) the MRI apparatus 20, select pulse sequences, and input imaging condition and processing condition.

Cameras 120A and 120B may be positioned at both ends of the upper part of bore 24. Cameras 120A and 120B capture images of the subject 100, respectively.

Receive Coil Unit

Figure 3:
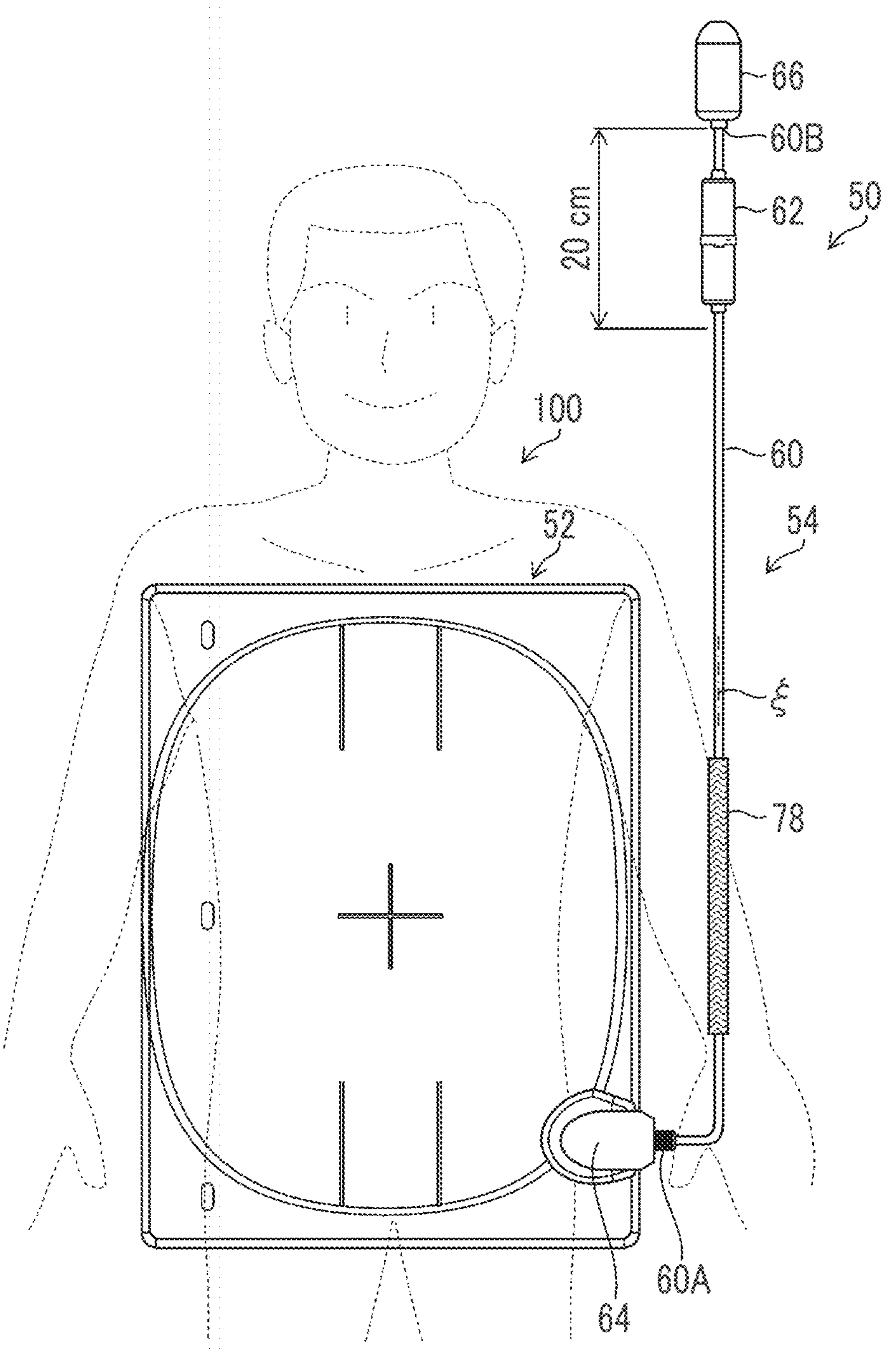
FIG. 3 is a plan view of the receive coil unit.

FIG. 3 is a plan view of the receive coil unit 50.

The receive coil unit 50 of the present example comprises a sheet-shaped receive coil 52 (in this example, a torso coil) and a receive cable 54 connected to the receive coil 52.

The receive coil 52 is flexible and configured to be thin and lightweight. The receive coil 52 is configured for multi-channel operation, with multiple sub-coil channels accommodated inside a bag-shaped sheet 56 that forms the outer covering of the receive coil 52.

These sub-coil channels function as antennas for receiving the NMR signals. The sub-coil channels are generally ring-shaped with a diameter of about 10 to 15 cm or square-shaped with sides of about 10 to 15 cm, and are two-dimensionally arranged inside the sheet 56 of the receive coil 52.

A decoupling circuit is provided for each of the sub-coil channels. Each decoupling circuit is provided with a voltage-driven field effect transistor (FET). The FET of each decoupling circuit is controlled ON/OFF by a driving voltage supplied from the decoupling power supply.

It should be noted that while the above-described decoupling circuit exemplifies ON/OFF switching by voltage control of the FET, the ON/OFF control can also be performed using switching by current control of a PIN diode or switching by voltage control of a micro electro mechanical systems (MEMS) device.

Each sub-coil channel is an antenna that receives the NMR signal from the subject 100 and is adjusted to resonate at a specific frequency. The specific frequency is determined by the atomic nucleus (typically, a hydrogen atomic nucleus) to be observed in a biological tissue, and a magnetic field intensity.

As shown in FIG. 3, the receive cable 54 comprises an elongated cable body 60 having an axis ξ and one balun 62 (also referred to as a clamp balun) provided on the cable body 60.

A coil connection portion 64 is provided at one end 60A of the cable body 60, and a plug connector 66 is provided at the other end 60B of the cable body 60.

Here, the function (role) of the balun 62 will be described. The balun 62 has the following two functions (first and second functions).

First Function

The first function is a function to cut off the mixed noise (common mode noise) that propagates from the MRI system to the receive coil 52 through the receive cable 54, at a point closer to the plug connector 66 side than the coil connection portion 64.

In this case, it is preferable to dispose the balun 62 at a location that is not directly beneath the point where the irradiation coil current reaches its maximum. The location is, for example, within 20 cm from the other end 60B of the cable body 60 toward the one end 60A.

As described above, the receive cable 54 according to the present example includes one end 60A provided with the coil connection portion 64, and the other end 60B provided with the plug connector 66 on the side opposite to the one end 60A. Then, one balun 62 is provided at a location closer to the other end 60B than to the one end 60A, and within 20 cm from the other end 60B toward the one end 60A.

By adopting such a configuration, the receive cable 54 of the present example can cut off common mode noise while suppressing temperature rise in the receive cable 54. As a result, high image quality can be ensured.

Second Function

The second function is a function to reduce the noise current induced on the receive cable 54 by RF irradiation.

The second function can suppress the heat generation occurring in the receive cable 54. In addition, it is possible to suppress unnecessary excitation of subjects outside the visual field, thereby improving image quality degradation issues such as aliasing artifacts.

Receive Cable of Comparative Example

Here, the receive cable of the comparative example will be described.

The receive cable of the comparative example comprises a cable body with a diameter of 1 cm and an axial length of 1 m, on which five baluns, each having a diameter of 3 cm and an axial length of 12 cm, are spaced at intervals.

The above-mentioned dimensions include manufacturing tolerances and other generally considered variations. The same applies to the following description a case where dimensions are indicated. In addition, "○ to □" indicating a numerical range means "○ or more and □ or less".

In a case where five baluns are provided, as in the receive cable of the comparative example, the weight of the entire receive cable increases, thereby increasing the burden on the imaging staff. In contrast to the flexible shield conductor, the balun is constructed of a rigid conductor or a plastic case. Therefore, the balun portion cannot be bent, and the greater the number of baluns, the more constraints there are on the handling work during the setting of the receive coil, resulting in an increased burden on the imaging staff.

Furthermore, in a case where viewing the receive cable of the comparative example, it does not appear to have intermittent thick portions (baluns with a diameter of 3 cm) along the axial direction of the receive cable. Instead, it appears to have intermittent thin portions (cable body with a diameter of 1 cm) within the series of five baluns. In other words, the receive cable gives the impression of having an increased diameter.

The reason for disposing five baluns on the cable body is based on the results of the temperature rise test of the receive cable. The temperature rise test is a test that measures the temperature of the receive cable under conditions where the balun is disposed directly below the location where the irradiation coil current is at its maximum (worst-case heat generation condition). As a result, five baluns were disposed as described above to disperse (suppress) the heat generation of the receive cable, ensuring that the surface temperature of the receive cable did not exceed the reference temperature.

As described above, the receive cable of the comparative example has five baluns with large diameters, making it a considerably heavy object. This increases the burden on the imaging staff. Therefore, from the viewpoint of reducing the burden on imaging staff, it is necessary to minimize the diameter and reduce the weight of the entire receive cable, including both the cable body and the baluns.

Receive Cable of Embodiment

Figure 4:
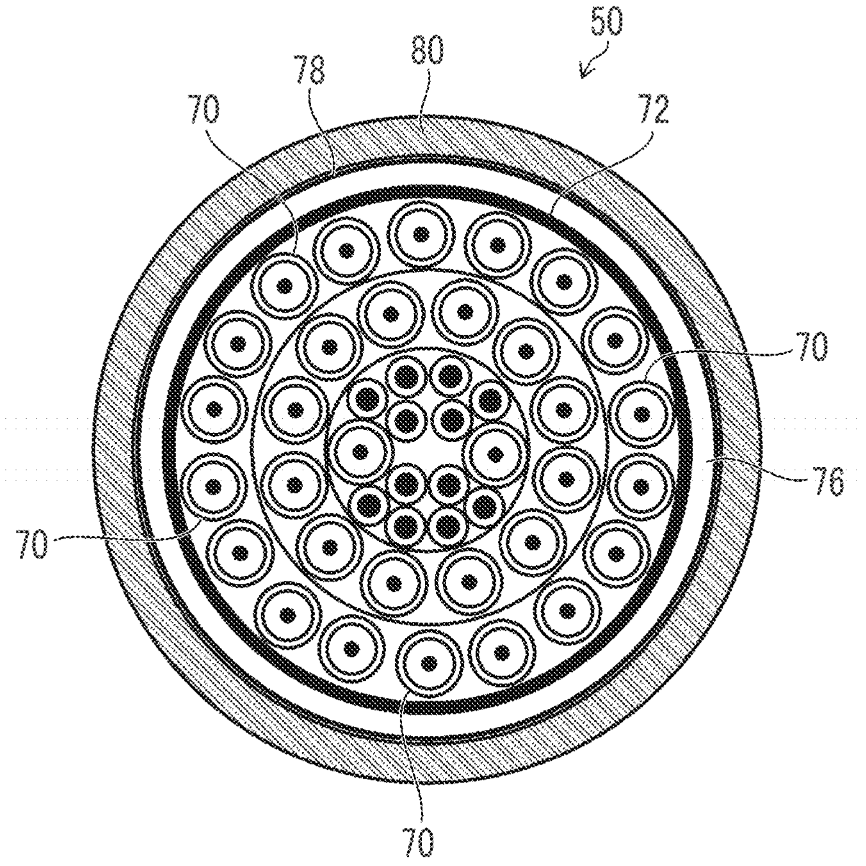
FIG. 4 is a cross-sectional view of the receive cable.
Figure 5:
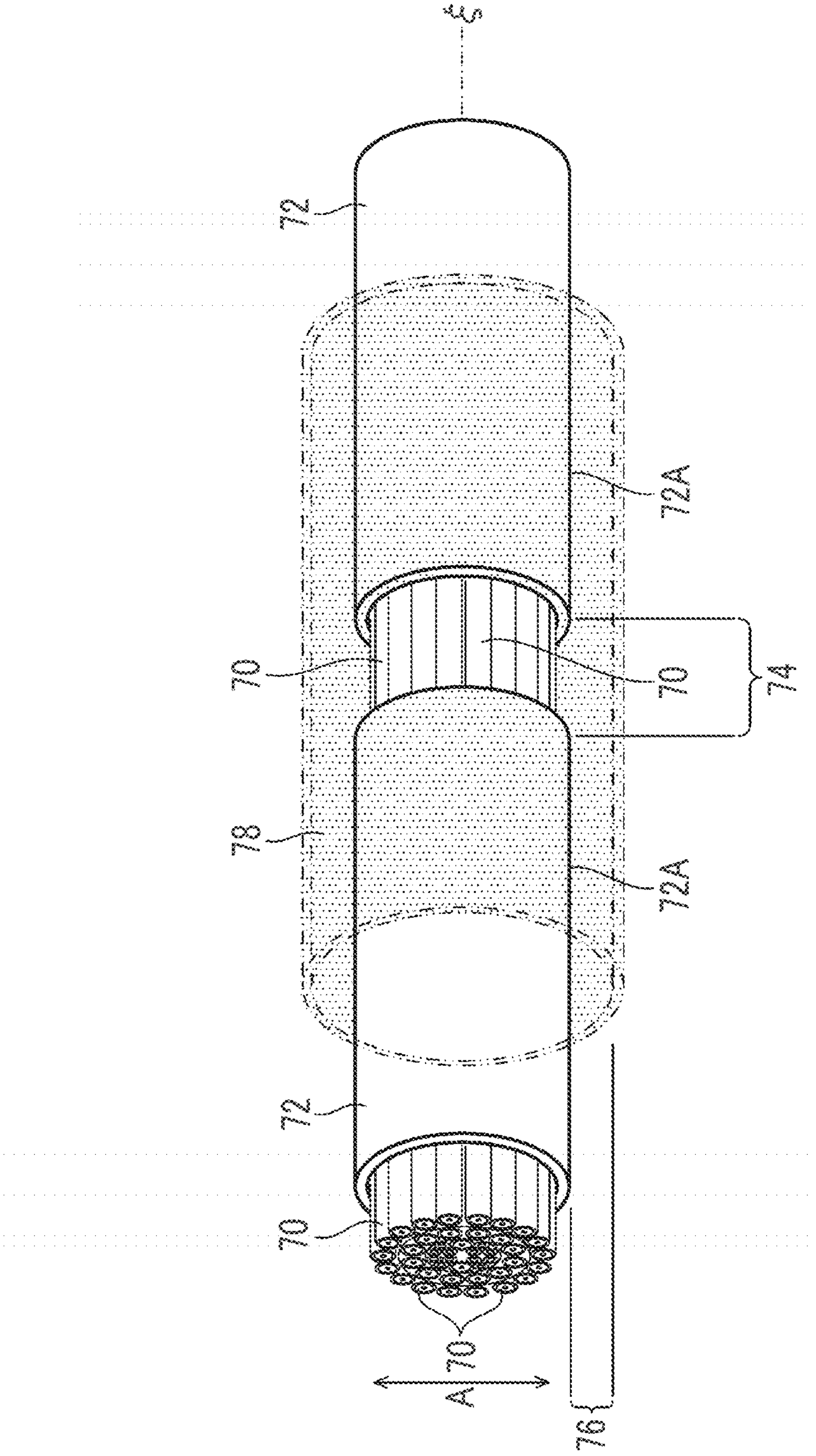
FIG. 5 is an enlarged perspective view showing the main structural configuration of the receive cable.

FIG. 4 is a cross-sectional view of the receive cable 54 according to the embodiment. FIG. 5 is a partially enlarged perspective view of the receive cable 54. In FIG. 5, a part of the receive cable 54 is shown transparently to illustrate the detailed configuration of the receive cable 54.

As shown in FIGS. 4 and 5, the receive cable 54 of the present example includes a coaxial cable 70. In FIGS. 4 and 5, multiple coaxial cables 70 corresponding to the multi-channel configuration of the receive coil 52 are shown. However, the number of coaxial cables 70 is not limited to multiple cables and may be a single cable. The coaxial cable 70 is an example of a signal line according to the present invention.

In addition, the receive cable 54 includes a tubular shield conductor 72 that accommodates the coaxial cable 70. The shield conductor 72 has at least one non-conductive cutout portion 74 at an intermediate portion in the axis ξ direction. The shield conductor 72 is an example of the shield conductor according to the present invention.

In addition, the receive cable 54 includes a tubular conductor 78 disposed with respect to the shield conductor 72 via a gap portion 76 in the diameter A direction of the shield conductor 72. The tubular conductor 78 overlaps with the cutout portion 74 and parts 72A, 72A of each of the two shield conductors 72 positioned on both sides of the cutout portion 74. Each of the parts 72A, 72A is a section facing each other in the axis ξ direction. The tubular conductor 78 is an example of the tubular conductor according to the present invention.

As described above, the receive cable 54 of the present example comprises the coaxial cable 70, the shield conductor 72 having the cutout portion 74, and the tubular conductor 78. In FIG. 4, reference numeral 80 denotes a sheath. The sheath 80 is a tubular insulator that constitutes the outermost layer of the cable body 60 (see FIG. 3).

With the receive cable 54 of the present example, by providing the cutout portion 74 in the shield conductor 72, the current (induction current) induced on the shield conductor 72 can be suppressed. As a result, it is possible to suppress the temperature rise occurring in the receive cable 54.

Figure 6:
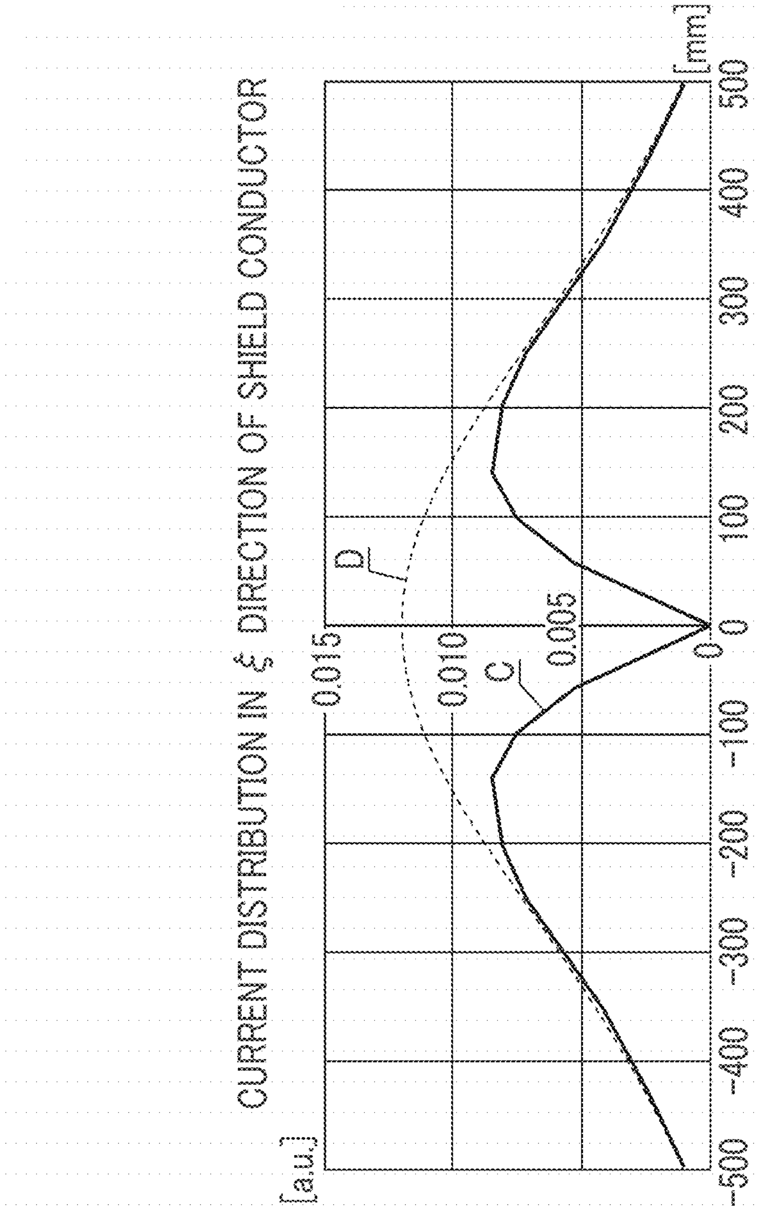
FIG. 6 is a graph showing the current distribution in the axial direction of the shield conductors, in cases where the cutout portion is provided and where it is not provided.

FIG. 6 is a graph showing the current distribution in the axis ξ direction of the shield conductor in cases where the cutout portion 74 is provided and where it is not provided. The numerical values on the vertical axis of the graph represent current values normalized for the case where unit power is supplied to the transmission coil.

In a case where the cutout portion 74 is provided, as shown by line C in FIG. 6, the current distribution exhibits a rapid decrease in induction current at the "0" position on the horizontal axis, which corresponds to the location of the cutout portion 74. In contrast, in a case where the cutout portion 74 is not provided, the current distribution has a peak value at the "0" position on the horizontal axis, as indicated by the broken line D in FIG. 6.

As is also evident from FIG. 6, providing the cutout portion 74 in the shield conductor 72 can suppress the current induced on the shield conductor 72.

On the other hand, a current is induced on the coaxial cable 70 due to the cutout portion 74, but this current is suppressed by the tubular conductor 78.

Figure 7:
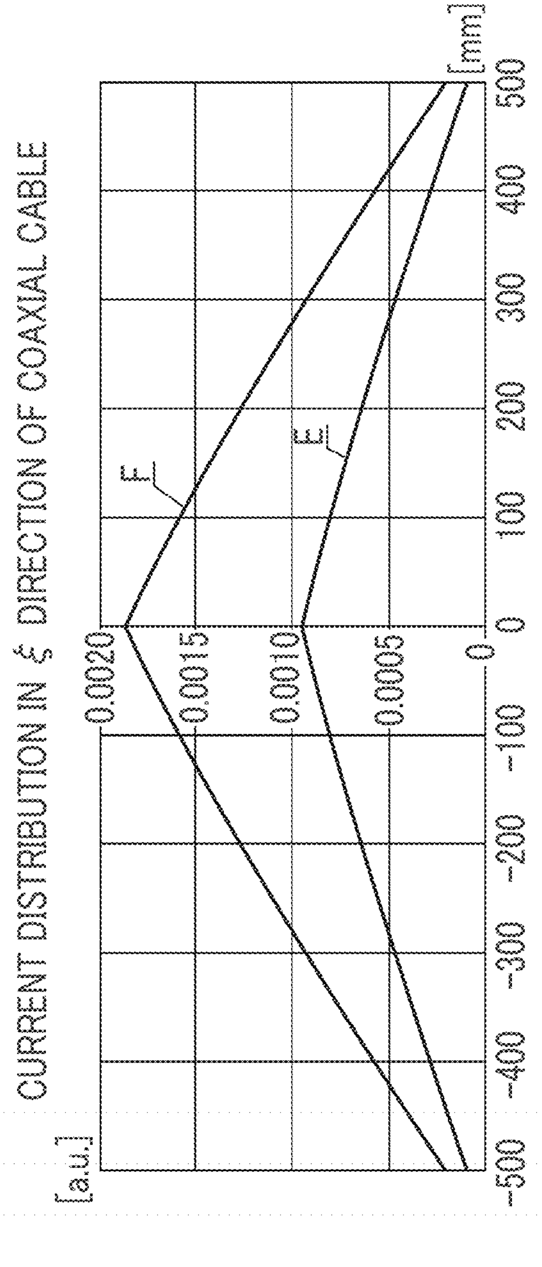
FIG. 7 is a graph showing the current distribution in the axial direction of a coaxial cable in cases where the tubular conductor is provided and where it is not provided.

FIG. 7 is a graph showing the current distribution in the axis ξ direction of the coaxial cable 70 in cases where the tubular conductor 78 is provided and where it is not provided.

A current distribution for the case where the tubular conductor 78 is provided is shown by line E in FIG. 7, and a current distribution for the case where the tubular conductor 78 is not provided is shown by line F in FIG. 7 (note that line E represents the result in a case where the gap length described later, is set to 2 mm). In a case where comparing the two cases, at the "0" position on the horizontal axis where the tubular conductor 78 is present, the peak value of the current with the tubular conductor 78 in place is reduced by half compared to the peak value without the tubular conductor 78.

As is also evident from FIG. 7, the current induced on the coaxial cable 70 can be suppressed by overlapping the tubular conductor 78 with the cutout portion 74. As a result, it is possible to suppress the temperature rise occurring in the receive cable 54. Note that in a case where the peak value of the current is halved, the amount of heat generation becomes ¼ ($(½)^2$). In addition, it is preferable that the current peak suppression effect at the balun mounting location is approximately 1/10, and that using the tubular conductor 78 achieves an unnecessary current suppression effect equivalent to that of the balun. In a case where comparing the current peak values of line E and line F in FIG. 7 with the current peak value of line D in FIG. 6, it can be observed that the current peak value of line E is smaller than 1/10 of the current peak value of line D, while the current peak value of line F is larger than 1/10 of the current peak value of line D.

As described above, in a case where the receive cable 54 of the present example is adopted, the induction current can be suppressed without using a balun. Consequently, the number of baluns 62, which account for approximately 80% of the weight of the receive cable 54, can be significantly reduced.

As a result, the entire receive cable 54 can be made smaller in diameter and lighter in weight, thereby reducing the burden on the imaging staff who handle the receive cable 54. Hereinafter, detailed description will be provided.

The effect of suppressing the induction current on the coaxial cable 70 depends on the distance of a gap between the shield conductor 72 and the tubular conductor 78 in the diameter A direction of the receive cable 54. In the following description, the aforementioned gap is referred to as a gap portion 76, and the aforementioned distance is referred to as a gap length.

Figure 8:
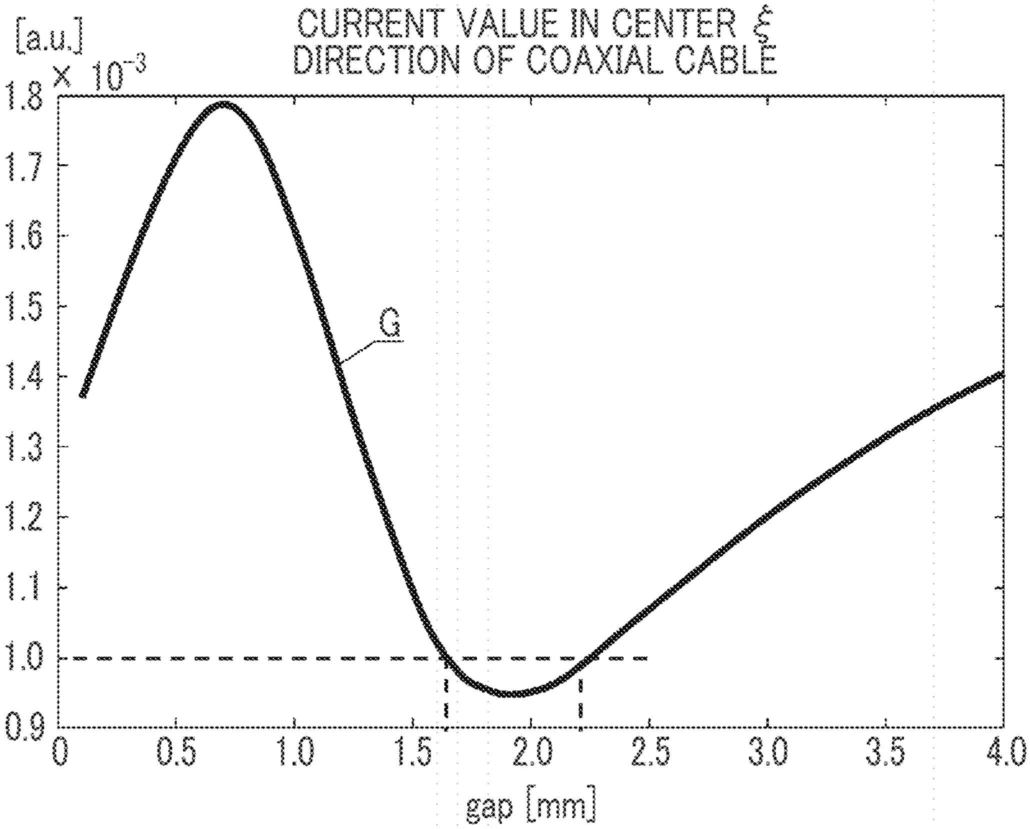
FIG. 8 is a graph showing the relationship between the gap length of the gap portion and the absolute value of an induction current.

For example, in a case where the axial length of the tubular conductor 78 is 120 mm, the gap portion 76 is filled with air, and the gap length is approximately 2 mm (corresponding to a capacitance of approximately 10 pF calculated from the overlapped area between the shield conductor 72 and the tubular conductor 78 in the axis ξ direction of the cable body 60), the effect of suppressing the induction current is maximized, as shown by line G in the graph of FIG. 8. This is due to the configuration of a resonance system near the cutout portion 74 of the shield conductor 72, as will be described later. Here, the gap length does not need to be strictly 2 mm, and the gap length may be varied within a range that provides an equal or greater current peak suppression effect compared to that of the balun (where the current peak value with the balun is 1/10 or less of the current peak value without the balun). For example, the gap range of 1.6 mm to 2.2 mm shown by the broken line in FIG. 8 exceeds the current peak suppression effect achieved by attaching a balun, and can be used without any practical issues.

Figure 9:
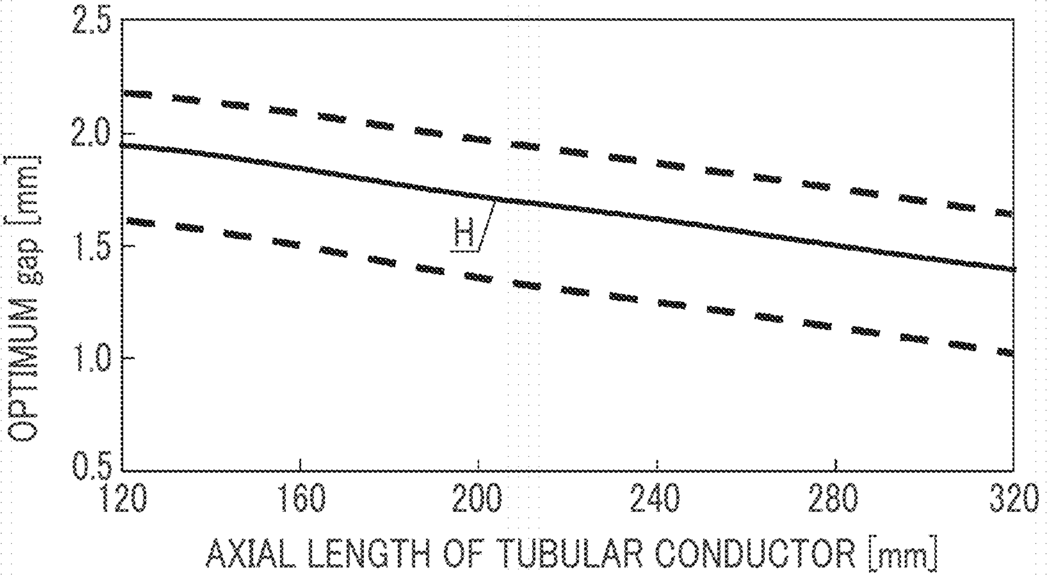
FIG. 9 is a graph showing the relationship between the axial length of the tubular conductor and the optimum gap of the gap portion.

In addition, as shown by line H in the graph of FIG. 9, the optimum gap length at which the induction current suppression effect is maximized tends to decrease as the axial length of the tubular conductor 78 increases. Here, the broken lines above and below line H in FIG. 9 indicate the range of gap lengths that provide an equal or greater current suppression effect compared to the balun for each axial length of the tubular conductor. For example, in a case where the axial length of the tubular conductor 78 is 320 mm, the range of gap lengths that exceed the current suppression effect of the balun is approximately 1 mm to 1.6 mm. In general, a thinner cable diameter is preferred as it is easier to handle, and consequently, a smaller gap length is favored by the imaging staff. In the case where the axial length of the tubular conductor 78 shown in FIG. 9 is 120 mm to 320 mm, the gap can be minimized to a range equal to or greater than the current suppression effect of the balun in a case where the tubular conductor 78 with an axial length of 320 mm is produced with a gap length of approximately 1 mm.

The tubular conductor 78 functions not merely as a conductor with a shielding function, but as part of a conductor that suppresses induction current by utilizing a resonance system.

That is, near the cutout portion 74 of the shield conductor 72, the overlapping part of the shield conductor 72 and the tubular conductor 78 functions as a capacitor, while the tubular conductor 78 functions as an inductor. This configuration resonates near the center frequency of the MRI apparatus 20 (for example, 63.88 MHz in the case where the magnetic field intensity is 1.5 T).

Here, the optimum gap length shown in FIG. 9 is for the case where the gap portion 76 is filled with air. However, forming (configuring) the gap portion 76 with a dielectric may facilitate the production of fixing the tubular conductor 78 to the cable body 60.

In a case where the gap portion 76 is formed of a dielectric, the inductance of the resonance system near the cutout portion 74 remains virtually unchanged, whereas the capacitance of the resonance system changes according to the relative permittivity of the dielectric.

Therefore, to achieve the suppression effect of the induction current, it is necessary to adjust the gap length based on the relative permittivity of the dielectric. By adjusting the gap length so that the resonance frequency in a case where the gap portion 76 is formed of a dielectric matches the resonance frequency in a case where the gap portion 76 is filled with air, it becomes possible to maximally suppress the induction current induced on the coaxial cable 70. In a case where the axial length of the tubular conductor 78 is constant and the gap portion 76 is entirely filled with a dielectric, to match the resonance frequency in a case where the gap portion is filled with air, the gap length needs to be adjusted to approximately the relative dielectric constant times the original gap length. However, in general, a smaller cable diameter, the easier it is to handle, and a shorter gap length improves the maneuverability of cable 70. Therefore, it is desirable that the dielectric filling the gap portion is a thermoplastic resin with a low relative permittivity. In particular, as the material for the dielectric filling the gap portion 76, a material having a relative permittivity of less than 3.5 is preferable. In general, materials with a relative permittivity of less than 3.5 are referred to as low dielectric constant materials.

In addition, the conductivity of the dielectric (material) generally increases as the relative permittivity increases. Since the conductivity of the dielectric causes heat generation, it is desirable from this viewpoint as well that the relative permittivity of the dielectric be as low as possible. In the present example, polytetrafluoroethylene (registered trademark: Teflon) is exemplified as a dielectric with a relative permittivity of less than 3.5. The dielectric with a relative permittivity of less than 3.5 is not limited to the aforementioned example; thermoplastic resins such as fluororesins and polyimides can also be applied.

The relative permittivity of polytetrafluoroethylene is about 2.1, which is low, and its volume resistivity is also sufficiently high at $10^{18}$ (Ω·m), allowing it to hardly conduct any current. Therefore, a dielectric made of polytetrafluoroethylene (for example, one configured in a sheet-like form) is suitable as the dielectric forming the gap portion 76.

In a case where the gap portion 76 is formed by a dielectric made of polytetrafluoroethylene, the approximate optimum gap length in a case where the axial length of the tubular conductor 78 is 120 mm is 1.9 mm×2.1~4 mm.

The shorter the axial length of the tubular conductor 78, the easier the production of the tubular conductor 78 becomes. Therefore, within the range of axial lengths from 120 mm to 320 mm for the tubular conductor 78, the easiest configuration to produce the tubular conductor is a case where the tubular conductor has an axial length of 120 mm and the gap portion 76 is formed using a dielectric with a low relative permittivity. In the case where the gap portion 76 is formed of a dielectric made of polytetrafluoroethylene, the gap length becomes approximately 4 mm as described above.

In this way, in a case where the axial length of the tubular conductor 78 is 120 mm to 320 mm and the gap portion 76 is filled with air or a dielectric made of polytetrafluoroethylene, setting the gap length to 1 mm to 4 mm allows the induction current generated on the coaxial cable 70 to be suppressed to a level equal to or greater than that of a balun.

The tubular conductor 78 is not limited to having an axial length of 120 mm to 320 mm. However, considering the need to ensure the flexibility of the cable body 60, which has a length of 1 m to 2 m, it is preferable that the axial length is within the above range.

The dielectric is not limited to polytetrafluoroethylene; any dielectric with a low relative permittivity can be applied. For example, polyimide can also be applied. Since the relative permittivity of polyimide is also low at about 3.2 and its volume resistivity is sufficiently high at $10^{16}$ (Ω·m), allowing almost no current flow, polyimide can also be applied as the dielectric forming the gap portion 76.

In addition, the entire region of the gap portion 76 may be formed of the dielectric, or only a part of the region may be formed of the dielectric. In this case, the gap portion 76 is formed by a dielectric and an air layer.

Since the resonance of the shield conductor 72 near the cutout portion 74 is weaker than the resonance of the balun 62, the heat generation is small even in a case where the cutout portion 74 is disposed at a position close to an irradiation coil for excitation. On the other hand, in a case where the balun 62 is disposed close to the irradiation coil, the balun 62 generates a large amount of heat.

Therefore, as described above, it is desirable to position the balun 62 within 20 cm from the connector side (the other end 60B) as a heat generation avoidance measure, ensuring it is not disposed close to the irradiation coil.

In addition, disposing the heavy balun 62 near the plug connector 66 rather than near the receive coil 52 can reduce the burden on imaging staff in a case where attaching the receive coil 52 to the subject 100.

In addition, it is preferable to adjust the thickness of the sheath 80, the axial length of the tubular conductor 78, and the dielectric of the gap portion such that the diameter of the tubular conductor 78 does not exceed the diameter of the sheath 80, which constitutes the outermost layer of the cable body 60.

In addition, if the material of the tubular conductor 78 is made of a flexible material such as a mesh conductor, it can be bent, and visually, it would appear only as a receive cable 54 with an outer diameter of about 1 cm. As a result, the burden of cable handling work for the imaging staff is reduced. Therefore, it is possible to reduce the burden on the imaging staff.

Hereinafter, manufacturing methods of the receive cable 54 (first and second manufacturing methods) will be described.

First Manufacturing Method

First, a part of the sheath 80 of the cable body 60 is removed over a range of 120 to 320 mm in axial length to provide a removal portion in the sheath 80.

Next, the cutout portion 74 is provided in the shield conductor 72 exposed through the removal portion.

Next, a gap portion 76 is formed using a dielectric with a low relative permittivity (for example, polytetrafluoroethylene).

Next, a tubular conductor 78 is attached to the outer periphery of the dielectric.

Finally, a sheath with a short axial length is attached to the outer periphery of the tubular conductor 78 to cover the removal portion.

Second Manufacturing Method

First, a part of the sheath 80 of the cable body 60 is removed over a range of 120 to 320 mm in axial length to provide a removal portion in the sheath 80.

Next, the cutout portion 74 is provided in the shield conductor 72 exposed through the removal portion.

Next, a dielectric with a low relative permittivity (for example, polytetrafluoroethylene) is attached to the inner periphery of the tubular conductor 78, and a heat-shrinkable tube is attached to the outer periphery of the tubular conductor 78.

Next, the tubular conductor 78 is attached to the removal portion of the sheath 80.

Next, the heat-shrinkable tube is heat-shrunk to fix the tubular conductor 78 around the cutout portion 74.

Finally, a sheath 80 with a short axial length for covering the heat-shrinkable tube is attached to the outer periphery of the heat-shrinkable tube.

The heat-shrinkable tube may alternatively serve as the sheath 80. In this case, the step of attaching the sheath 80 can be omitted.

Figure 10:
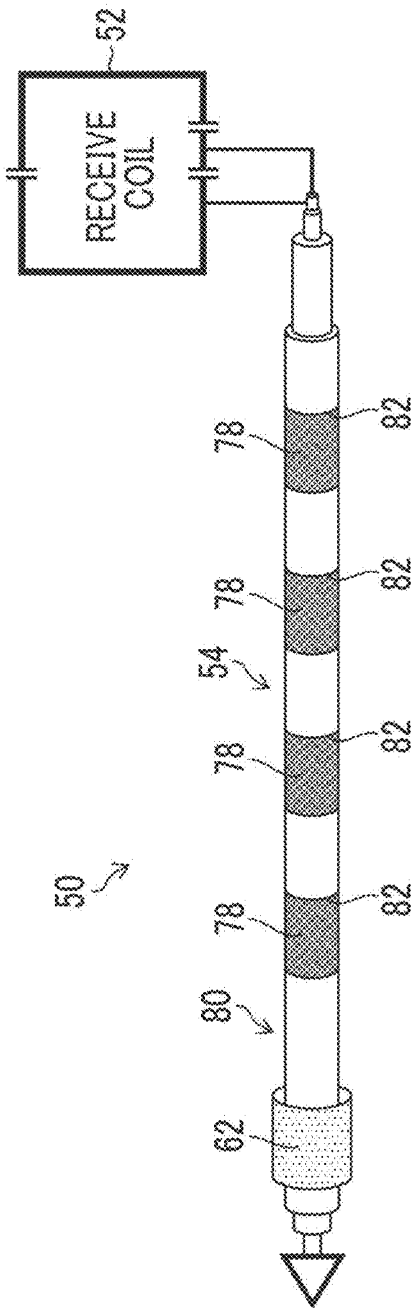
FIG. 10 is an explanatory view of a receive cable provided with multiple tubular conductors.

In the present example, a receive cable 54 with one cutout portion 74 provided in the shield conductor 72 has been described. However, two or more cutout portions 74 may be provided. For example, FIG. 10 shows a receive cable 54 in which five cutout portions 74 are provided, and a tubular conductor 78 overlaps with each cutout portion 74. FIG. 10 also shows a removal portion 82 provided in the sheath 80.

In the present example, while a torso coil is illustrated as the receive coil 52 to which the present invention is applied, the invention is not limited to this. The present invention can be applied to all receive coils that have a receive cable. For example, the receive cable may be incorporated under the top plate 34 (in a state where the receive cable cannot be visually recognized from the outside). In this case as well, multiple baluns are provided under the top plate 34 (in a state where the baluns cannot be visually recognized from the outside) to reduce the noise current induced on the receive cable. By applying the present invention and reducing the number of these baluns, it becomes possible to utilize the space below the top plate 34, which was previously allocated for the installation of baluns, for other purposes. For example, in a case where the vacant space is used to increase the thickness of the top plate 34, the load-bearing capacity of the top plate 34 can be improved. Alternatively, the receiving performance of the MRI apparatus can be improved by effectively utilizing the vacant space below the top plate 34, such as by increasing the number of channels of the AD converter.

The embodiments of the receive cable and medical image diagnostic system according to the present invention have been described above. However, various improvements or modifications may be made without departing from the scope of the present invention.

EXPLANATION OF REFERENCES

10: medical image diagnostic system
20: MRI apparatus
50: receive coil unit
52: receive coil
54: receive cable
60: cable body
60A: one end
60B: other end
62: balun
64: coil connection portion
66: plug connector
70: coaxial cable
72: shield conductor
74: cutout portion
76: gap portion
78: tubular conductor
80: sheath
82: removal portion

What is claimed is:

1. A receive cable comprising:
a signal line;
a tubular shield conductor that accommodates the signal line and has at least one non-conductive cutout portion at an intermediate portion in an axial direction;
a tubular conductor that overlaps with the cutout portion and a part of each of two shield conductors located on both sides across the cutout portion, and is disposed with respect to the shield conductor via a gap portion in a radial direction of the shield conductor; and
a tubular sheath that covers the shield conductor;
wherein the sheath has a removal portion at a position corresponding to the cutout portion, and
the tubular conductor having a diameter equal to or smaller than a diameter of the sheath is disposed in the removal portion.

2. The receive cable according to claim 1,
wherein the gap portion is formed of a dielectric using a thermoplastic resin having a relative permittivity of less than 3.5.

3. The receive cable according to claim 2, wherein the dielectric is made of polytetrafluoroethylene or polyimide.

4. The receive cable according to claim 1, wherein in a case where an axial length of the tubular conductor is 120 mm to 320 mm and the gap portion is formed of air or a dielectric with low relative permittivity, a length of the gap portion in the radial direction is 1 mm to 4 mm.

5. The receive cable according to claim 1, wherein the tubular conductor is a flexible mesh member.

6. A medical image diagnostic system comprising:

the receive cable according to claim 1; and a magnetic resonance imaging apparatus.

7. A receive cable comprising:

a signal line;

a tubular shield conductor that accommodates the signal line and has at least one non-conductive cutout portion at an intermediate portion in an axial direction; and a tubular conductor that overlaps with the cutout portion and a part of each of two shield conductors located on both sides across the cutout portion, and is disposed with respect to the shield conductor via a gap portion in a radial direction of the shield conductor;

wherein the receive cable includes one end at which a coil connection portion is provided and the other end opposite the one end at which a connector is provided, and a single balun is provided at a position closer to the other end than the one end.

8. The receive cable according to claim 7, wherein the balun is provided at a position within 20 cm from the other end toward the one end.

* * * * *